United States Patent
Slater, Jr. et al.

(10) Patent No.: US 6,803,243 B2
(45) Date of Patent: Oct. 12, 2004

(54) LOW TEMPERATURE FORMATION OF BACKSIDE OHMIC CONTACTS FOR VERTICAL DEVICES

(75) Inventors: David B. Slater, Jr., Raleigh, NC (US); Alexander Suvorov, Durham, NC (US)

(73) Assignee: Cree, Inc., Durham, NC (US)

( * ) Notice: Subject to any disclaimer, the term of this patent is extended or adjusted under 35 U.S.C. 154(b) by 113 days.

(21) Appl. No.: 10/003,331

(22) Filed: Oct. 31, 2001

(65) Prior Publication Data

US 2002/0179910 A1 Dec. 5, 2002

Related U.S. Application Data

(63) Continuation-in-part of application No. 09/787,189, filed on Mar. 15, 2001.

(51) Int. Cl.[7] .............................................. H01L 21/00
(52) U.S. Cl. ........................................... 438/20; 257/97
(58) Field of Search ........................ 438/20, 29, 42–43, 438/738, 931, 39; 257/10–11, 77, 97, 103, 510, 622

(56) References Cited

U.S. PATENT DOCUMENTS

| | | | | |
|---|---|---|---|---|
| 4,759,836 A | * | 7/1988 | Hill et al. | 204/192.21 |
| 4,947,218 A | | 8/1990 | Edmond et al. | |
| 5,124,779 A | | 6/1992 | Furukawa et al. | |
| 5,235,195 A | | 8/1993 | Tran et al. | |
| 5,270,554 A | | 12/1993 | Palmour | |
| 5,323,022 A | | 6/1994 | Glass et al. | |
| 5,409,859 A | | 4/1995 | Glass et al. | |
| 5,914,499 A | * | 6/1999 | Hermansson et al. | 257/77 |
| 6,011,279 A | | 1/2000 | Singh et al. | |
| 6,015,459 A | | 1/2000 | Jamison et al. | |
| 6,268,229 B1 | * | 7/2001 | Brandes et al. | 438/20 |
| 2001/0010449 A1 | | 8/2001 | Chiu et al. | |
| 2002/0096684 A1 | * | 7/2002 | Brandes et al. | 257/77 |

FOREIGN PATENT DOCUMENTS

| | | |
|---|---|---|
| EP | 0276002 A2 | 7/1988 |
| EP | 0 789 388 A2 | 8/1997 |
| JP | 09082663 | 3/1997 |
| WO | WO 98/37584 A1 | 8/1998 |
| WO | PCT WO 00/16382 A1 | 3/2000 |

OTHER PUBLICATIONS

Spiess (aka "Spiess"), Aluminum implantation of p–SiC for ohmic contacts, First European Conference on Silicon Carbide and Related Materials (ECSCRM 96), Oct. 6–9, 1996, pp. 1414–1419, vol. 6; No. 10, Elsevier, Switzerland.

Dev Alok et al, Low Contact Resistivity Ohmic Contacts to 6H–Silicon Carbide, Proceedings of the International Electron Devices Meeting, 1993, pp. 691–694, IEEE, New York.

Chen et al., Contact Resistivity of Re, Pt and Ta Films on n–Type Beta–SiC: Preliminary Results, Materials Science and Engineering, Jan. 1, 1995, pp. 185–189, vol. B29, No. 1/03, Elsevier Sequoia, Lausanne.

Porter et al, A critical review of ohmic and rectifying contacts for silicon carbide, Materials Science and Engineering, Nov. 1, 1995, pp. 83–105, vol. B34, No. 2/03, Elsevier Sequoia, Lausanne.

(List continued on next page.)

*Primary Examiner*—David Nelms
*Assistant Examiner*—David Vu
(74) *Attorney, Agent, or Firm*—Summa & Allan, P.A.

(57) ABSTRACT

A method for forming an ohmic contact to silicon carbide for a semiconductor device comprises implanting impurity atoms into a surface of a silicon carbide substrate thereby forming a layer on the silicon carbide substrate having an increased concentration of impurity atoms, annealing the implanted silicon carbide substrate, and depositing a layer of metal on the implanted surface of the silicon carbide. The metal forms an ohmic contact "as deposited" on the silicon carbide substrate without the need for a post-deposition anneal step.

15 Claims, 2 Drawing Sheets

OTHER PUBLICATIONS

A. Moki et al.; "Low Resistivity As–Deposited Ohmic Contacts to 3C–SiC"; Journal of Electronic Materials; 1995; pp. 315–318; vol. 24, No. 4.

T. Tadao et al,; "Lowering the Annealing Temperature of Ni/SiC for Ohmic Contacts under N(2) Gas, and Application to a UV Sensor"; Materials Science Forum; pp. 989–992; vols. 338–342 (2000).

* cited by examiner

US 6,803,243 B2

LOW TEMPERATURE FORMATION OF BACKSIDE OHMIC CONTACTS FOR VERTICAL DEVICES

This is a continuation in part of Ser. No. 09/787,189 filed Mar. 15, 2001.

FIELD OF THE INVENTION

The present invention relates to ohmic contacts to semiconductor materials. In particular, the invention relates to methods of forming ohmic contacts to devices that include a plurality of semiconductor materials.

BACKGROUND OF THE INVENTION

In the microelectronics context, circuits are made from the sequential connection of semiconductor devices. Generally speaking, semiconductor devices are operated by, and are used to control, the flow of electric current within specific circuits to accomplish particular tasks. To connect semiconductor devices in a circuit, appropriate contacts must be made to the semiconductor devices. Because of their high conductivity and other chemical properties, the most useful and convenient materials for making contacts to such devices are metals.

Metal contacts between semiconductor devices and circuits should interfere either minimally or preferably not at all with the operation of the device or the circuit. Furthermore, the metal contact must be physically and chemically compatible with the semiconductor material to which it is made or attached. The types of contact that exhibit these desired characteristics are known as "ohmic contacts."

An ohmic contact is usually defined as a metal-semiconductor contact that has a negligible contact resistance relative to the bulk or spreading resistance of the semiconductor, Sze, *Physics of Semiconductor Devices*, Second Edition, 1981, page 304. As further stated therein, an appropriate ohmic contact will not significantly change the performance of the device to which it is attached, and it can supply any required current with a voltage drop that is appropriately small compared with the drop across the active region of the device.

Ohmic contacts and methods of producing ohmic contacts are known in the art. For example, U.S. Pat. Nos. 5,409,859 and 5,323,022 to Glass et al. ("the Glass patents"), the entire contents of which are incorporated herein by reference, discuss an ohmic contact structure formed of platinum and p-type silicon carbide and a method of making the ohmic structures. Although ohmic contacts and methods of making them are known, the known methods for producing ohmic contacts, and especially those produced using a silicon carbide substrate, are difficult even when properly conducted.

The problems associated with obtaining ohmic contacts are myriad and cumulative. Limited electrical conductivity of the semiconductor due to low hole or electron concentrations may hinder or even prevent the formation of an ohmic contact. Likewise, poor hole or electron mobility within the semiconductor may hinder or even prevent the formation of an ohmic contact. As discussed in the Glass patents, work function differences between the contact metal and semiconductor may give rise to a potential barrier resulting in a contact exhibiting rectifying (non-ohmic) current flow versus applied voltage. Even between two identical semiconductor materials in intimate contact with greatly differing electron-hole concentrations, a potential barrier (built-in potential) may exist, leading to a rectifying rather than ohmic contact. In the Glass patents, these problems were addressed by inserting a distinct p-type doped SiC layer between the p-type SiC substrate and the contact metal.

More difficult problems are encountered when forming ohmic contacts for newer generation gallium and indium based semiconductor devices. The formation of an ohmic contact between a semiconductor and a metal requires the correct alloying of the semiconductor and the contact metal at their interface. Selectively increasing the hole/electron concentration at the semiconductor surface where the ohmic contact metal is deposited is known as an effective means for enhancing the contact process to achieve an ohmic contact. This process is typically achieved through ion implantation, which is well recognized as a selective doping technique in silicon and silicon carbide technologies. However, in the case of silicon carbide, ion implantation is usually performed at elevated temperatures (typically >600° C.) in order to minimize damage to the silicon carbide crystal lattice. "Activating" the implanted atoms to achieve the desired high carrier concentrations often requires anneal temperatures in excess of 1600° C., often in a silicon over-pressure. The equipment required for this ion implantation technique is specialized and expensive.

After the high temperature ion implant and subsequent anneal, the contact metal is deposited on the implanted substrate surface and annealed at temperatures in excess of 900° C. This method of forming contacts on semiconductor devices that incorporate gallium nitride or indium gallium nitride is not feasible because these compounds disassociate at elevated temperatures.

One theoretical answer to this problem would be to form an ohmic contact on the substrate prior to growing the delicate epitaxial layers (e.g. gallium nitride layers) necessary to complete the semiconductor device. This approach is undesirable, however, because it inserts an undesired contaminant, the contact metal, into the epitaxial growth system. The contaminant metal can affect epitaxial growth by interfering with lattice growth, doping, rate of reaction or all of these factors. In addition, metal impurities can degrade the optical and electrical properties of the epitaxial layers.

Similarly, many semiconductor devices such as metal-oxide-semiconductor field-effect transistors ("MOSFETS") require a layer of a semiconductor oxide (e.g. silicon dioxide). The high temperatures associated with traditional ion implantation techniques and implant or contact metal annealing processes place high stress on oxide layers, which can damage oxide layers, the semiconductor-oxide interface and the device itself. Alternatively, forming the ohmic contact prior to creating the oxide layer is not practical because the oxidizing environment utilized to form the oxide layers has adverse effects on the ohmic contact.

In parent application Ser. No. 09/787,189, it has been discovered that an ohmic contact can be successfully formed on silicon carbide by increasing the carrier concentration adjacent the surface on which the contact is to be formed, annealing the silicon carbide, adding the metal contact, and then annealing the contact, but at a temperature low enough to avoid degrading any of the temperature-sensitive epitaxial layers (e.g. certain Group III nitrides) on the silicon carbide.

Nevertheless, such technique still requires the second anneal, with its potential for affecting the epitaxial layers.

Accordingly, a need exists for a practical and economical method for forming an ohmic contact for use in conjunction with a semiconductor device that does not exhibit the manufacturing problems previously discussed. The need also exists for a type of a semiconductor device that incorporates an ohmic contact but is economic to manufacture.

OBJECT AND SUMMARY OF THE INVENTION

It is an object of the invention is to provide a semiconductor device that incorporates an ohmic contact.

It is a further object of the invention to provide a semiconductor device comprising silicon carbide and an ohmic contact.

It is a further object of the invention to provide a semiconductor device that incorporates an ohmic contact that is economic to manufacture.

It is a further object of the invention to provide a method for forming a semiconductor device that can incorporate an ohmic contact formed from an increased choice of metals.

The invention meets these objects with a method for forming a metal-semiconductor ohmic contact for a semiconductor device. The method comprises implanting a selected dopant material into a surface of a semiconductor substrate having an initial conductivity type. The implanted dopant provides the same conductivity type as the semiconductor substrate. The dopant implantation is followed by annealing the implanted semiconductor substrate at a temperature and for a time sufficient to activate the implanted dopant atoms and increase the effective carrier concentrations. Depositing a metal on the implanted surface of the semiconductor material follows the anneal. In the present invention, selecting the proper dopant and metal permits the ohmic contact to be formed without further anneal, thus precluding any negative effect of such anneal on the remainder of the structure.

The invention also meets these objects with a semiconductor device comprising a semiconductor substrate having a surface and a first conductivity type. The semiconductor substrate includes a zone of increased carrier concentration in the substrate extending away from the surface. The device further comprises a layer of metal deposited on the surface of the substrate to form an ohmic contact at the interface of the metal and the zone of increased carrier concentration.

The foregoing and other objects, advantages and features of the invention and the manner in which the same are accomplished, will become more readily apparent upon consideration of the following detailed description of the invention taken in conjunction with the accompanying drawings, which illustrate exemplary embodiments, and wherein:

DETAILED DESCRIPTION

The present invention is a semiconductor device incorporating an ohmic contact and a method of forming the ohmic contact.

It will be understood by those familiar with wide bandgap semiconductors, such as silicon carbide, and semiconductor devices formed therefrom that the invention is most useful in making a semiconductor device and ohmic contact utilizing n-type silicon carbide (SiC). Accordingly, for ease of explanation, the following description of the invention and examples will be directed toward an embodiment of the invention utilizing SiC. Those skilled in the art, however, will readily recognize that the invention may be easily adapted for use with other wide-bandgap semiconductor materials such as the group III-nitrides (e.g. gallium nitride, aluminum gallium nitride, and indium gallium nitride.)

In a broad aspect the invention is a semiconductor device comprising a semiconductor substrate having an initial concentration of dopant imparting an initial conductivity type. In the preferred embodiments, the substrate is n-type silicon carbide.

The claimed semiconductor device is further characterized in that the semiconductor substrate is defined by a zone of increased carrier concentration extending from the surface of the substrate opposite the epitaxial layers toward the surface adjacent the epitaxial layers. A layer of metal is deposited on the substrate at the zone of increased carrier concentration to form an ohmic contact at the interface of the metal and the substrate. In the preferred embodiments, the metal is selected from the group consisting of silver (Ag) aluminum (Al), nickel (Ni) titanium (Ti), and platinum (Pt).

Figure 1:
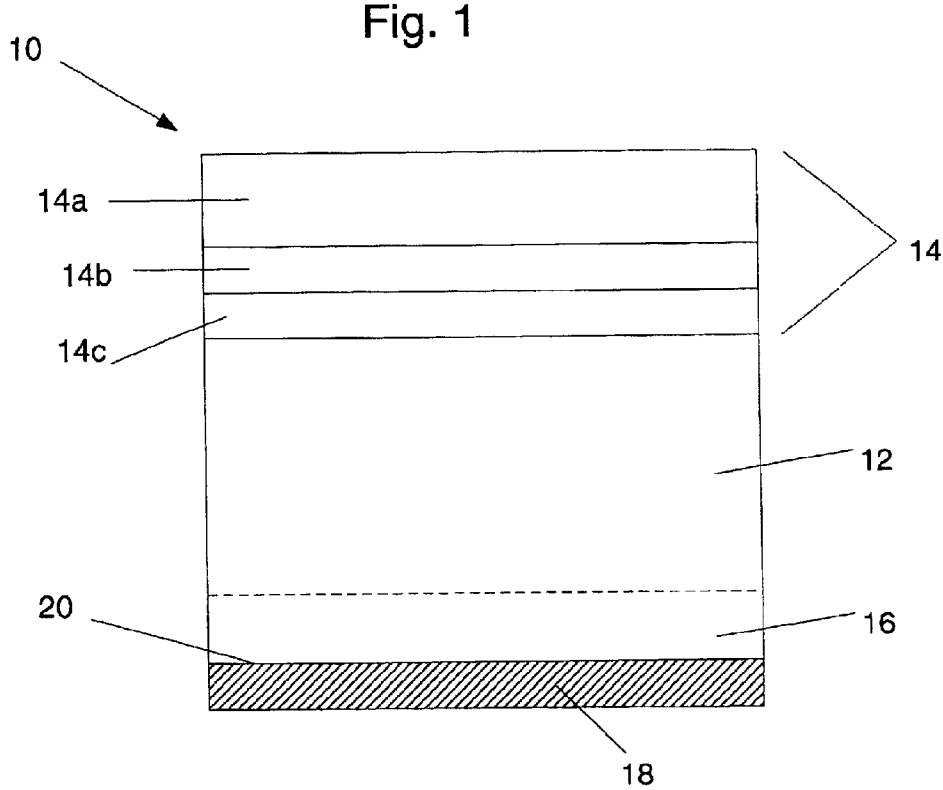
FIG. 1 is a schematic cross-sectional diagram of a semiconductor device according to the present invention.

Referring now to FIG. 1, a schematic of a semiconductor device 10 according to the invention is presented. The device 10 comprises a semiconductor substrate 12, which for purposes of explanation is considered to be SiC. It should be understood, however, that other wide-bandgap semiconductor materials may be used as a substrate in the practice of the invention.

Situated adjacent the SiC substrate 12 are the additional components 14 necessary to complete the semiconductor device. For example and as represented in FIG. 1, the semiconductor device may be a light emitting diode ("LED") having sequential expitaxial layers 14a, 14b, and 14c of p-type and n-type semiconductor materials. In a preferred embodiment, the invention is a semiconductor device such as an LED, metal-oxide-semiconductor field-effect transistor ("MOSFET"), laser, or Schottky rectifier that is comprised of several epitaxial layers situated adjacent a conductive semiconductor substrate on which an electrical contact is formed. As will be discussed later, the device according to the invention is particularly suited for semiconductor devices that comprise materials having low melting or low disassociation temperatures or which otherwise comprise heat-sensitive structures. Such materials include the group III-nitrides such as gallium nitride, indium gallium nitride and aluminum gallium nitride, or devices which include a sensitive interface such as a SiC—SiO$_2$ interface.

The claimed device is further characterized as having a zone of increased carrier concentration 16 on the backside of the semiconductor substrate. In other words, the semiconductor substrate, in this case SiC, has a carrier concentration near the surface of the substrate opposite the epitaxial layers that is higher than the carrier concentration exhibited in the remainder of the substrate.

The line that serves as the boundary to the zone of increased carrier concentration 16 is dotted to represent the fact that there is no sharp boundary at which the carrier concentration in the substrate 12 suddenly changes. The carrier concentration decreases as the distance from the backside surface of the substrate increases until the carrier concentration equals the initial carrier concentration. As will be discussed below, the zone of increased carrier concentration is formed by a room temperature ion implantation technique using dopants commonly associated with semiconductor materials.

For example and still referring to FIG. 1, a preferred embodiment of the claimed device broadly designated at 10 comprises an n-type SiC substrate doped with nitrogen. The SiC substrate 12 is preferably slightly to highly doped and possesses an initial carrier concentration between about $1\times10^{15}$ and about $1\times10^{19}$ cm$^{-3}$. The terms "slightly" and "highly" are imprecise and are purposely used to show that the initial carrier concentration may vary considerably. Through ion implantation of a selected dopant material at the surface opposite the epitaxial layers 14, a zone 16 is created that contains a higher carrier concentration than the remainder of the substrate 12. Phosphorus (P) is the preferred implanted dopant and the ion implantation is preferably conducted at a level that creates a zone of increased carrier concentration 16 on the backside of the substrate that exhibits a carrier concentration between about $1\times10^{19}$ and about $1\times10^{20}$ cm$^{-3}$ and that is always higher than the initial carrier concentration.

Although Applicant does not wish to be bound by a particular theory, evidence suggests that forming a zone of increased carrier concentration 16 allows for the creation of a metal contact that exhibits ohmic properties, especially when the zone is formed by means of ion implantation. In a preferred embodiment, a selected contact metal 18 having a melting point, vapor pressure and physical and chemical properties suitable for use with the overall semiconductor device is deposited at the surface of the SiC substrate at the zone of increased carrier concentration 16 to form an interface 20 between the metal and the substrate. Preferred metals include silver, titanium, aluminum, nickel, and platinum. Preferably, the selected metal has a work function less than or equal to that of platinum. The preferred selection of metal depends on the intended application of the device. For example, for applications in which reflectivity of the contact is important, aluminum or silver may be the preferred choice. In applications in which an extremely stable, non-reactive contact metal is required (such as, for example, applications involving extreme temperatures), platinum may be the preferred choice for the contact metal. The method of the invention is particularly advantageous in forming light emitting diodes (LEDs) from the Group III nitrides (e.g., the nitrides of Ga, Al and In, and their ternary and quaternary combinations). First, the elimination of the contact annealing step enhances the technique of adding Group III nitride epitaxial layers to the SiC substrate prior to adding the contact metal. Additionally, the use of phosphorus as the added dopant opens a wider choice of metals for the ohmic contact. In particular, the ability to use a reflective metal such as silver (Ag) or aluminum (Al) as an ohmic contact can substantially enhance the light output of an LED formed in this manner.

Again, although the Applicant does not wish to be bound by any particular theory, it appears useful to create the zone of increased carrier concentration to serve as the receptor for the contact metal. Thus, in another embodiment, the invention comprises the method of forming the ohmic contact utilized in the previously described semiconductor device.

In a broad aspect, the invention is a method for forming a metal-semiconductor contact for a semiconductor device. In the preferred embodiment, the method comprises implanting phosphorus into an n-type silicon carbide substrate. Those skilled in the art, however, will readily recognize that the invention may be easily adapted for use with other semiconductor materials. An annealing step follows the implanting of the selected dopant material. In this annealing step the implanted SiC substrate is annealed at a temperature and for a time sufficient to activate the implanted phosphorus atoms to effectively increase the carrier concentration of the implanted dopant atoms in the SiC substrate. A contact metal is then deposited on the implanted surface of the SiC substrate.

In a broadest embodiment, the semiconductor substrate may comprise a n-type or p-type substrate that may possess a slight, moderate, or high initial dopant concentration. For example, where n-type SiC is the substrate, the SiC substrate may possess an initial dopant concentration from about $1\times10^{15}$ cm$^{-3}$ (slightly doped) to $1\times10^{19}$ cm$^{-3}$ (highly doped). The terms "slight," "moderate," and "high" are imprecise and are used to indicate that the initial concentration of dopant in the substrate material may vary. Testing has shown that moderate to highly doped substrates achieve the best results with the invention.

The n-type silicon carbide substrate is then implanted with phosphorus and annealed. Preferably, the phosphorus implantation occurs at room temperature and the subsequent annealing occurs at a temperature above about 1000° C. and most preferably above about 1300° C. In the preferred embodiments, the n-type SiC is initially doped with nitrogen.

Those skilled in the art will readily recognize that the implanting of the dopant material may be accomplished at high temperatures. In fact, high temperature implantation is typically preferred in the SiC context in order to reduce damage to the SiC lattice structure. In the SiC context, however, high temperature ion implantation places constraints on the commercial use of the invention. Ion implanting equipment with the capability of heating the SiC substrate during implantation is atypical, expensive and intended for research and development rather than lower cost, higher volume applications. Furthermore, when SiC substrates are heated to high temperatures, they must be heated and cooled at a rate that will not produce fractures thereby slowing down the production process.

Accordingly, room temperature implantation is the preferred implantation method for use in the invention. It has been discovered that room temperature implanting of phosphorus followed by an annealing step in a simple vented furnace capable of reaching 1300° C. and holding 100 or more substrate wafers achieves satisfactory results and greatly increases throughput.

Figure 2:
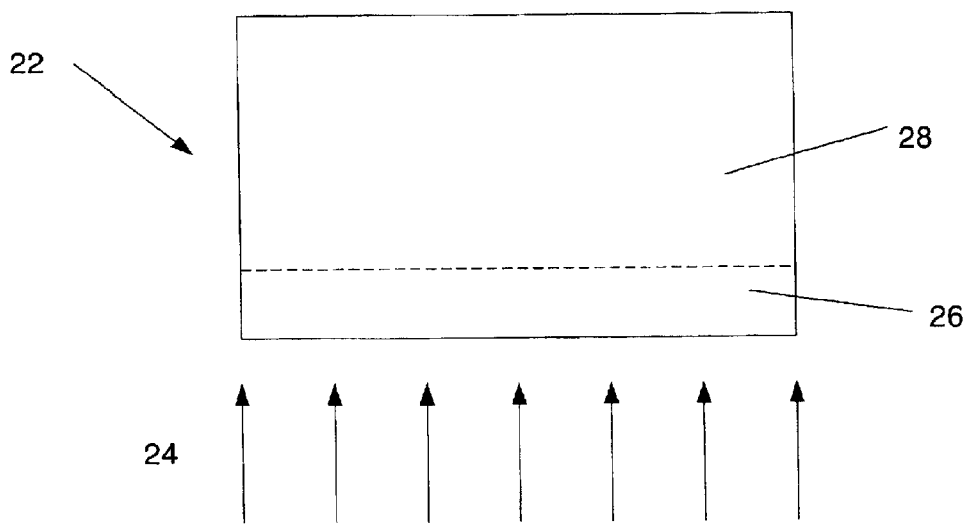
FIG. 2 is a schematic cross-sectional diagram of a dopant implantation as utilized in the method according to the invention.

The room temperature implantation of dopant is preferably conducted so as to create a zone of increased dopant concentration near the implanted surface of the semiconductor substrate. FIG. 2 is a schematic representation of the implantation process according to the invention. In this example, an n-type SiC substrate 22 having an initial dopant concentration of approximately $1\times10^{18}$ cm$^{-3}$ is implanted with atomic phosphorus 24 at energies of 25 to 100 keV with doses of $10^{15}$ cm$^{-2}$ or more. In some instances more than one implant energy may be used to create a block or graduated dopant distribution. A "block distribution" refers to a dopant distribution in which the concentration of dopant atoms remains substantially level over a predetermined thickness. A block distribution may be approximated by employing multiple implant energies. In one embodiment, the implantation process produces a zone 26 near the implanted surface of the SiC substrate approximately 1000 angstroms in depth having a total chemical dopant concentration near the implanted surface of approximately $10^{20}$ to $10^{21}$ cm$^{-3}$ with the concentration of the implanted dopant decreasing as the distance from the implanted surface increases. The dopant concentration outside of the zone of increased dopant concentration 26 remains substantially the same as the initial dopant concentration. The boundary of the zone of increased carrier concentration 26 is represented as a dotted line to indicate that the change in carrier concentration between the zone 26 and the remainder of the substrate is not distinct but gradual. Those skilled in the art should recognize that the implantation energy or the dose may be readily changed to achieve desired concentrations and thicknesses. For example, multiple implants may be performed to create a thicker zone of increased dopant concentration so that an ohmic contact may be made even if some material is removed during subsequent processing steps.

As mentioned previously, it is necessary to anneal the implanted substrate. The annealing is required because some of the implanted dopant ions are not "active" immediately after implantation. The term "active" is used to describe the availability of the implanted ions to contribute to the overall carrier concentration of the implanted substrate.

During implantation, the crystal lattice of the SiC substrate is essentially bombarded by dopant ions. These ions crash into the crystal lattice where they are retained. This bombardment does not result in a perfect insertion of dopant ions into the existing crystal lattice. The initial positioning of many of the dopant ions may prevent the ions from being "active" participants in the crystal lattice, which itself may be damaged by the bombardment. Annealing (i.e., heating) the implanted SiC substrate provides a mechanism by which the implanted ions and the crystal lattice of the substrate may rearrange in a more orderly fashion and recover from the damage incurred during the dopant implantation.

Using round numbers solely for explanatory purposes, the implanting process may be thought of as follows. If 100 phosphorus ions are implanted in an n-type SiC substrate having an initial concentration of x phosphorus atoms, immediately after implantation the substrate may only exhibit the characteristics associated with a substrate having "x+10" phosphorus ions. However, if the substrate is then annealed and the implanted ions are allowed to settle into position in the crystal lattice, the substrate may exhibit the characteristics associated with a substrate having "x+90" phosphorus ions. Thus, the annealing step has "activated" approximately 80 of the implanted phosphorus ions.

Testing shows that annealing the room temperature implanted SiC substrate at temperatures above approximately 1000° C. and in particular above approximately 1300° C. for about two hours or less will yield satisfactory results. The temperature and time may be easily adjusted to achieve a more complete activation of the implanted dose.

The semiconductor device comprising the above-discussed implanted substrate possesses at least one epitaxial layer. The epitaxial layer may be grown by any means known to those skilled in the art. However, the desired epitaxial layer or subsequently fabricated device may be made of or comprise a material (e.g., gallium nitride or a silicon oxide) incapable of withstanding the high temperature anneal of the implanted substrate. In this instance, the epitaxial layer may be formed after the dopant implantation. If the epitaxial layer is made of a material that is capable of withstanding the high temperature anneal, such as a silicon carbide epitaxial layer, then the epitaxial layer may be formed prior to dopant implantation and activation.

After the semiconductor substrate is implanted and a well annealed zone of increased dopant concentration is established, the metal selected to form the ohmic contact is applied to the surface of the substrate at the zone of increased carrier concentration. The metal may be just about any metal typically used in forming electrical contacts that possesses an appropriately high melting point and vapor pressure and does not interact adversely with the substrate material. Preferred metals include silver, aluminum, nickel, titanium and platinum. Preferably, the metal has a work function equal to or less than the work function of platinum.

Preferably, the contact metal is deposited on the substrate surface to form an ohmic contact layer. As noted above, and in an improvement over the method of the parent application, the use of phosphorus as the implanted dopant provides for an ohmic contact using a wider choice of contact metals, and results in an ohmic contact without any further annealing step.

In a more specific embodiment of the invention, an ohmic contact according to the invention was created using a n-type SiC substrate which was first implanted at an energy of 25 keV with a $10^{15}$ cm$^{-2}$ dose of atomic phosphorus followed by a second implantation at 50 keV at $10^{15}$ cm$^{-2}$ and a third implantation at 100 keV at $10^{15}$ cm$^{-2}$. The implantation was followed by an activation anneal at 1300° C. for 75 minutes in an argon ambient in a furnace. Subsequently, titanium was deposited as the contact metal on the implanted surface at a thickness of 150 Angstroms. The resulting contact exhibited satisfactory ohmic properties without any further anneal.

The invention offers a substantial advantage for vertical devices such as photodetectors, light emitting diodes (LEDs), lasers, power devices such as metal-oxide-semiconductor field-effect transistors (MOSFETs), insulated gate bipolar transistors (IGBTs), pn junctions and Schottky rectifiers, and microwave devices such as SITs (static induction transistors). In the case of detectors, LEDs and lasers, epitaxially grown group III-nitride gallium nitride and indium gallium nitride layers are not to be subjected to anneals at temperatures that would severely damage the layers. In the case of indium gallium nitride, time at elevated temperatures becomes more critical as the indium composition of the alloy increases. Eliminating the backside contact anneal temperature also reduces the potential for cracking in or disassociation of indium or gallium components in the strained heteroepitaxial films grown on SiC substrates.

In the case of power devices where homoepitaxial films of SiC are grown on the substrate and thermally grown or thermally regrown (reoxidized or annealed), oxides have an integral role in the device performance and a lower anneal temperature is an advantage. The backside metal contact cannot be subjected to the oxidizing ambient that is required to grow the SiC-silicon dioxide interface. Therefore, the backside ohmic contact must be deposited and annealed after the silicon dioxide is grown (reoxidized or regrown). Unfortunately, prior art anneal temperatures of about 850° C. or greater are required to subsequently form a contact to the back of the substrate (more typically 900° to 1050° C.) will create defects at the SiC-silicon dioxide interface due to mismatches in the rate of thermal expansion. This is particularly bad for MOSFETs and IGBTs. Thus, by eliminating the contact anneal, the invention provides a significant advantage in the manufacture and performance of these types of devices.

Figure 3:
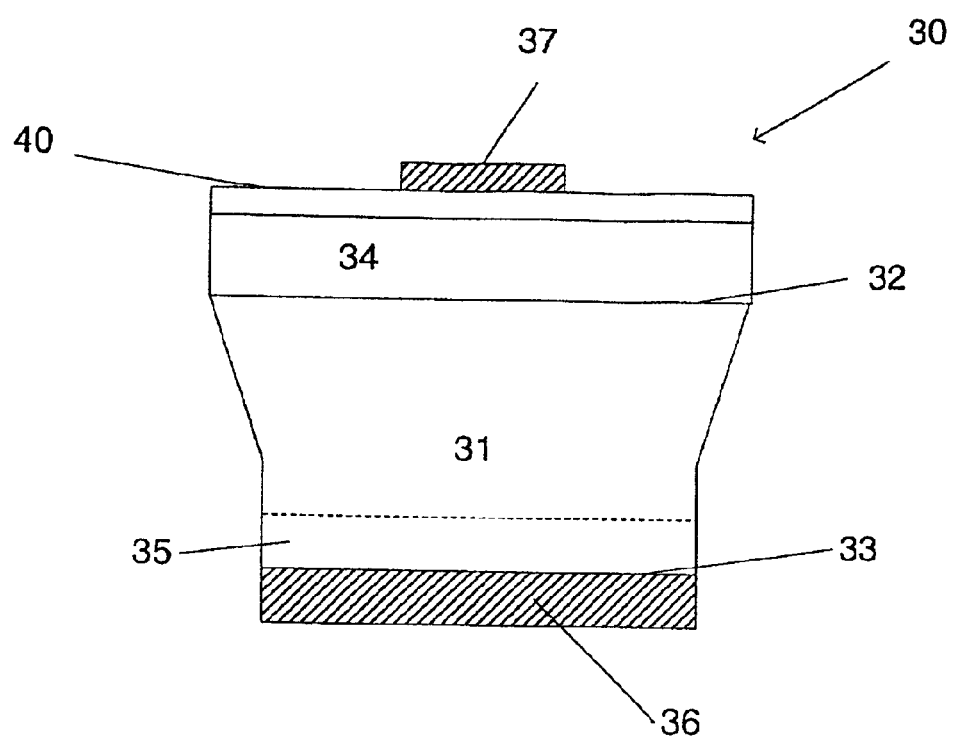
FIG. 3 is a schematic cross-sectional diagram of a light emitting diode according to the present invention.

In another aspect, the invention is a light emitting diode that incorporates the implantation and ohmic contact aspects of the present invention. FIG. 3 is an exemplary illustration in schematic fashion of such a light emitting diode broadly designated at 30. In this embodiment, the light emitting diode 30 includes an n-type silicon carbide substrate 31 having respective first and second surfaces 32 and 33. The diode includes a Group III-nitride active layer 34 on the first surface 32 of the substrate 31. As set forth in the previous embodiments, the diode further includes a zone 35 of increased carrier concentration in the substrate 31 and extending from the second surface 33 of the substrate 31 towards the first surface 32 with the zone 35 being characterized by a concentration of phosphorus that progressively decreases from the second surface 33 toward the first surface 32.

An ohmic contact 36 is present on the second surface of the substrate and another ohmic contact 37 is made on the opposite side of the device 30. In the illustrated embodiment, the diode 30 includes the additional p-type contact layer 40, which provides part of the conductive path between the active region 34 and the ohmic contact 37.

It will also be understood by those familiar with these devices and of ordinary skill in this art that the active region 34 can be one or more of a number of structures which typically can include homojunctions, single heterojunctions, double heterojunctions, superlattices, and quantum well structures. These structures for the active layer are well understood in the art and exemplary devices and structures are set forth in commonly assigned and co-pending applications Ser. Nos. 60/294,308 filed May 30, 2001 and 60/294,378 filed May 30, 2001. The contents of both of these are incorporated entirely herein by reference.

Similarly, the active region 34 and the structures that form the active region 34 are typically formed of one or more of the Group III nitrides, compounds that are generally understood as consisting of gallium nitride, aluminum nitride, indium nitride, aluminum gallium nitride, indium gallium nitride, aluminum indium nitride, and aluminum indium gallium nitride. Such compounds are also often abbreviated by an abbreviation such as $In_XGa_YAl_{(1-x-y)}N$, and as these abbreviations and their meaning are well understood in this art, they will not be discussed in any particular detail herein.

In the more preferred embodiments, the ohmic contact 36 to the substrate 31 is selected from the group consisting of aluminum, titanium, nickel, silver and platinum. In some applications, silver offers a number of advantages. These include its high workability as a precious metal and its excellent electrical properties for contact use. Silver and aluminum are particularly advantageous for a light emitting diode because of their highly reflective character, which enhances the efficiency and output of photonic devices such as the LED 30. Other metals may be more suited for other applications. For example, titanium and nickel offer superior electrical characteristics, but are not highly reflective.

SiC technology is in its infancy and many proposed devices and material structures are yet to be examined or developed. Further development of this process may lead to anneal temperatures that are even lower, ultimately leading to an ohmic contact between the metal and the semiconductor as deposited (i.e., no anneal).

The invention has been described in detail, with reference to certain preferred embodiments, in order to enable the reader to practice the invention without undue experimentation. However, a person having ordinary skill in the art will readily recognize that many of the components and parameters may be varied or modified to a certain extent without departing from the scope and spirit of the invention. Furthermore, titles, headings, or the like are provided to enhance the reader's comprehension of this document, and should not be read as limiting the scope of the present invention. Accordingly, only the following claims and reasonable extensions and equivalents define the intellectual property rights to the invention.

That which is claimed is:

1. A method for forming an ohmic contact to silicon carbide for a semiconductor device, the method comprising:
   implanting phosphorus atoms into a surface of an n-type silicon carbide substrate thereby forming a layer on the silicon carbide substrate having an increased concentration of phosphorus;
   thereafter annealing the implanted silicon carbide substrate;
   thereafter growing at least one epitaxial layer on a surface of the silicon carbide substrate opposite the implanted surface; and
   thereafter depositing a layer of metal on the implanted surface of the annealed silicon carbide that forms an ohmic contact between the phosphorus-implanted silicon carbide and the deposited metal.

2. A method according to claim 1 comprising implanting the phosphorus at room temperature.

3. A method according to claim 1 wherein the first annealing the implanted silicon carbide substrate occurs at a temperature between about 1000° C. and 1300° C.

4. A method according to claim 1, wherein the implanted silicon carbide substrate is annealed at a temperature at or above about 1000° C.

5. A method according to claim 1, wherein the implanted silicon carbide substrate is annealed at a temperature at or above about 1300° C.

6. A method according to claim 1 wherein the metal is selected from the group consisting of titanium, aluminum, nickel, silver and platinum.

7. A method according to claim 1 wherein the metal has a work function equal to or lower than the work function of platinum.

8. A method according to claim 1 wherein said implanted phosphorus forms a zone of increased carrier concentration in said silicon carbide substrate.

9. A method according to claim 8 wherein said concentration of phosphorous progressively decreases away from said surface.

10. A method according to claim 8 wherein said concentration of phosphorus is approximately level for a predetermined thickness in said silicon carbide substrate.

11. A method according to claim 8 wherein said zone of increased carrier concentration is at least about 1000 Å thick.

12. A method according to claim 1 comprising implanting phosphorous at a plurality of implant energy levels.

13. A method according to claim 1 comprising implanting phosphorus at an implant energy level of 25 keV at a dose of $10^{15}$ cm$^{-2}$ or more.

14. A method according to claim 13 further comprising implanting phosphorous at an implant energy level of 50 keV at a dose of $10^{15}$ cm$^{-2}$ or more.

15. A method according to claim 14 further comprising implanting phosphorus at an implant energy level of 100 keV at a dose of $10^{15}$ cm$^{-2}$ or more.

* * * * *